US 6,730,922 B2

(12) United States Patent
Lin et al.

(10) Patent No.: US 6,730,922 B2
(45) Date of Patent: May 4, 2004

(54) ANTI-ELECTRON REFLECTOR ARRANGEMENT

(75) Inventors: Hsi-Hsiang Lin, Hsinchu (TW); Chien-Yang Chen, Hsinchu Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/237,899

(22) Filed: Sep. 10, 2002

(65) Prior Publication Data

US 2004/0046132 A1 Mar. 11, 2004

(51) Int. Cl.[7] .................................................. H01J 37/08
(52) U.S. Cl. .............................. 250/492.22; 250/492.1; 250/492.2; 250/492.3
(58) Field of Search ....................... 250/492.22, 492.21, 250/492.2, 492.3, 492.1; 430/5

(56) References Cited

U.S. PATENT DOCUMENTS

| | | | |
|---|---|---|---|
| 6,017,658 A | * | 1/2000 | Rhee et al. ............... 250/492.2 |
| 6,033,134 A | * | 3/2000 | Maruyama et al. ......... 396/611 |
| 6,596,444 B2 | * | 7/2003 | Buck .............................. 430/5 |
| 6,605,394 B2 | * | 8/2003 | Montgomery et al. .......... 430/5 |
| 2003/0027406 A1 | * | 2/2003 | Malone ....................... 438/471 |
| 2003/0039922 A1 | * | 2/2003 | Han et al. ................... 430/312 |
| 2003/0049940 A1 | * | 3/2003 | Matsuhashi et al. ........ 438/745 |

OTHER PUBLICATIONS

The American Heritage College Dictionary, 3rd edition; 2000, Houghton Mifflin Company; p. 57.*

* cited by examiner

Primary Examiner—John R. Lee
Assistant Examiner—James P. Hughes
(74) Attorney, Agent, or Firm—Rabin & Berdo, P.C.

(57) ABSTRACT

An electron anti-reflection arrangement includes a substrate, an electron resistant layer formed on a top side of the substrate, and an electron anti-reflective layer provided in between the substrate and the electron resistant layer for enabling an electron beam to pass to the inside of the substrate in an incident direction and minimizing the amount of electrons of the electron beam that return to the electron resistant layer after reflection by the substrate.

10 Claims, 3 Drawing Sheets

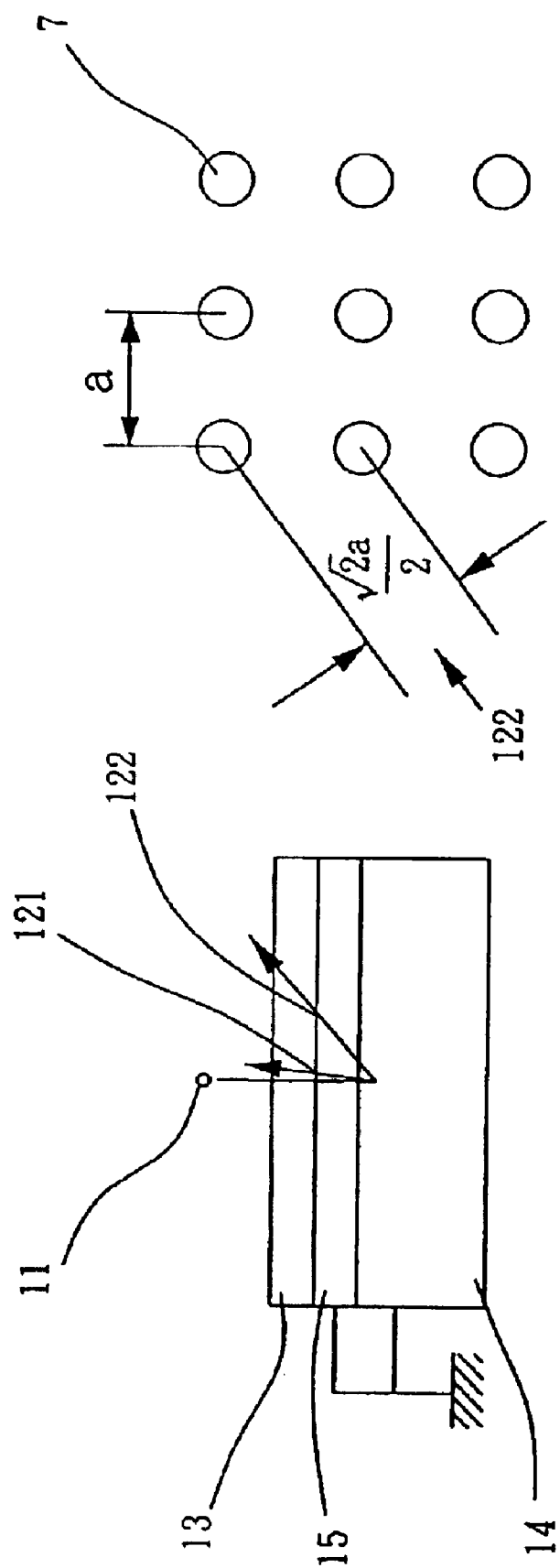

ANTI-ELECTRON REFLECTOR ARRANGEMENT

BACKGROUND OF THE INVENTION

1. Field of the Invention

The present invention relates to an electron anti-reflection arrangement and, more particularly, to an anti-reflection arrangement for use in electron-beam lithography to improve electron-beam lithography precision.

2. Description of Related Art

When incident electrons penetrate an electron resistant layer to collide with substrate atoms, a number of incident electrons return to the substrate surface through a relatively great angle of scattering, thereby causing the electron resistant layer around the exposed area to receive an extra exposure dosage that affects the profile and depth of the surrounding exposure pattern. This phenomenon is called the electron beam proximity effect.

In detail, as shown in FIG. 1, when an incident electron beam 1 strikes the electron resistant layer 3, a number of incident electrons collide with atoms of the electron resistant layer 3. Because the arrangement of the electron resistant layer is sparse and the atomic spacing of the electron resistant layer is broad, a number of incident electrons fall at a relatively small forward scattering angle $\theta_f$, thereby causing the diameter of the incident electron beam 1 to be increased after passing through the electron resistant layer. When the incident electron beam 1 passes the electron resistant layer 3 to the substrate 4, a number of incident electrons fall at a relatively greater backward scattering angle $\theta_b$, due to relatively smaller atomic spacing of the substrate 4, and a number of incident electrons may return to the electron resistant layer 3. As illustrated in FIG. 1, the incident electron beam 1 originally has an incident diameter d; however the diameter of the reflected electron beam 2 becomes D after forward scattering and backward scattering, which is much greater than the incident diameter d. This condition directly affects the dimensions of the pattern of the surrounding exposure. Due to different electron beam proximity effects, it is difficult to control the accuracy of pattern dimensions.

When proceeding with photo mask fabrication by an E-beam writer according to conventional methods, increasing the electron beam accelerating voltage and changing the exposure resistant layers and substrate material so as to reduce the formation of backward scattering electrons and lower the effect of backward scattering electrons is a priority. There are known conventional methods using an E-beam recorder to fabricate compact disk molds. These methods are used to improve the electron beam proximity effect by increasing the electron beam accelerating voltage. However, since such accelerating voltage must be as high as 100 KV, much higher than the accelerating voltage a regular 30~40 KV electron gun can provide, it results in high abeam recorder costs. Therefore, these methods are still not perfect. Further, increasing the electron beam accelerating voltage to 100 KV will lower the sensitivity of the electron resistant layer to electrons, resulting in low E-beam recorder productivity levels.

Therefore, it is desirable to provide an electron anti-reflection arrangement that improves the electron beam proximity effect.

SUMMARY OF THE INVENTION

The present invention has been accomplished under the circumstances in view.

The main object of the present invention is to provide an electron anti-reflection arrangement that improves the problems resulting from electron beam proximity effects during electron beam lithography.

Another object of the present invention is to provide an electron anti-reflection arrangement that improves the problem of electron beam proximity effects, and greatly reduces equipment cost and increases productivity.

To achieve these and other objects of the present invention, the electron anti-reflection arrangement comprises a substrate, an electron resistant layer formed on a top side of the substrate, and at least one electron anti-reflective layer provided in between the substrate and the electron resistant layer. Each said at least one anti-reflective layer comprises a composition having an atomic number smaller than that of said substrate, and atoms in said at least one anti-reflective layer have an arrangement sparser than that of atoms in said substrate, i.e., atoms in said at least one anti-reflective layer have an atomic spacing greater than that of said substrate so that the amount of backward scattering ofelectrons is minimized when the electron beam strikes the substrate.

Further, in the electron anti-reflective layer, the atomic spacing in the incident direction of the electron beam is greater than that in the reflective direction, i.e., at least one anti-reflective layer is directional so that the arrangement of atoms in the electron beam incident direction is sparser to facilitate the incidence of the electron beam; the arrangement of atoms in the oblique reflective direction is relatively denser to impede the return of reflected electrons to the electron resistant layer.

Each electron anti-reflective layer can be formed on the substrate by deposition coating, for example, sputtering deposition, evaporation deposition, or any other equivalent deposition method. In one embodiment of the present invention, two anti-reflective layers are provided wherein the first anti-reflective layer is composed of carbon or aluminum while neighboring the substrate; the second anti-reflective layer is composed of silicon dioxide or silicon nitride while neighboring the electron resistant layer.

Other objects, advantages, and novel features of the invention will become more apparent from the following detailed description when taken in conjunction with the accompanying drawings.

BRIEF DESCRIPTION OF THE DRAWINGS

FIG. 2a is a sectional view of the first embodiment of the present invention.

FIG. 2b is a microscopic view of the first embodiment of the present invention.

DETAILED DESCRIPTION OF THE PREFERRED EMBODIMENT

Figure 1:
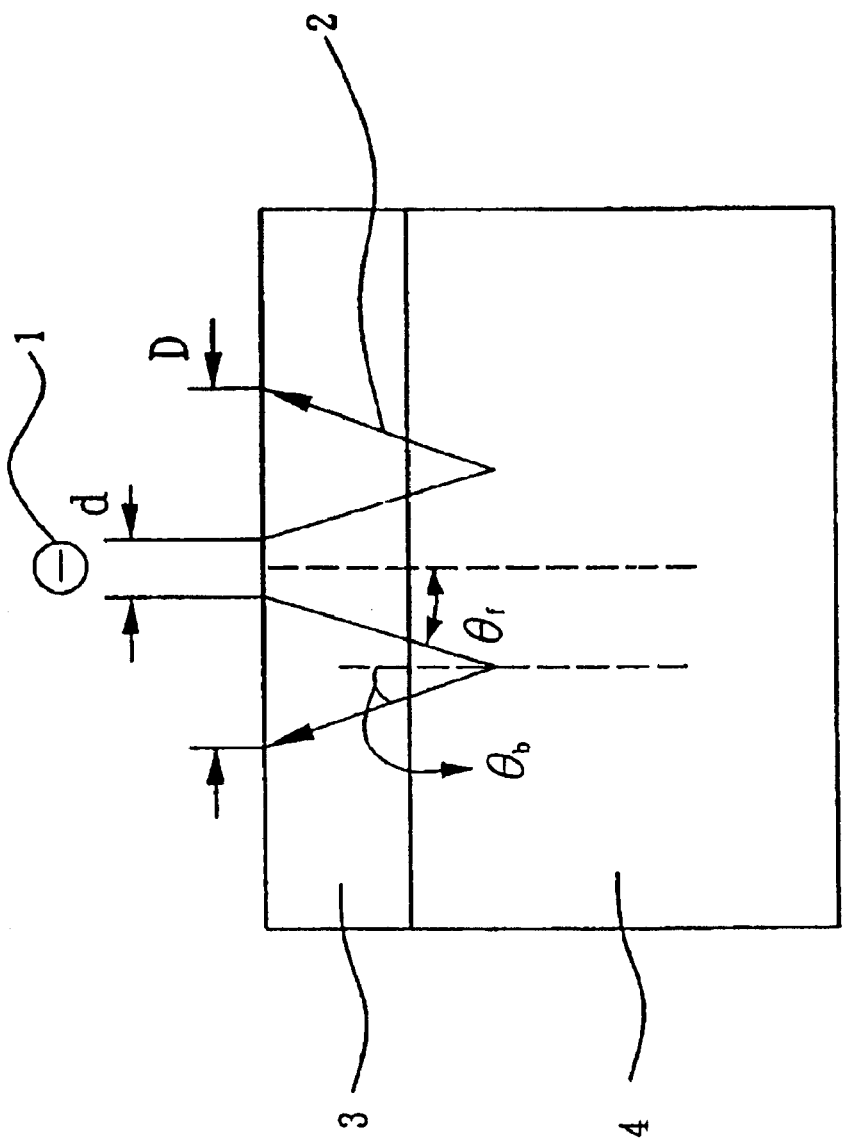
FIG. 1 is a schematic drawing showing the electron beam proximity effect.

With reference to FIGS. 2a and 2b, the first embodiment of the present invention comprises a directional electron anti-reflective layer 15 provided in between an electron resistant layer 13 and a silicon substrate 14. As illustrated in FIG. 2a, when an incident electron beam 11 strikes the substrate directly vertically, the so-called "directional" anti-reflective layer 15 has an atomic spacing a in the direction of the incident electron beam 11. When the incident electron beam strikes substrate atoms and causes a reflection, two different electron backward scattering paths might happen. That is, a relatively great backward scattering angle, electron beam 121, and relatively small backward scattering angle, electron beam 122, might be produced. Because the backward scattering electron beam 121 does not affect the shape of exposure significantly and its return direction is close or almost equal to the direction of the electron anti-reflective layer, the directional electron anti-reflective layer does not block the reflection of the incident electron beam onto the electron resistant layer.

Referring to FIG. 2b again, assume the angle $\theta_b$ of the backward scattering electron beam 122 is 45°. The atomic spacing of the directional anti-reflective layer in this direction is relatively small, or about $\sqrt{2}a/2$. This small atomic spacing limits the angle of backward scattering, thereby causing the forward path for backward scattering electrons 122 to be narrowed and the possibility of the return of backward scattering electrons to the electron resistant layer to be reduced, and therefore unnecessary exposure is eliminated and, the accuracy of electron beam exposure is greatly improved. The angle $\theta_b$ of the backward scattering electron beam 122 is an assumed angle for explanation only but not a fixed value.

The material of the substrate can be metal, glass, or any manufacturing material using electron beams as an exposure light source. According to this embodiment, the silicon substrate is used to make a compact disk molds.

Figure 3A:
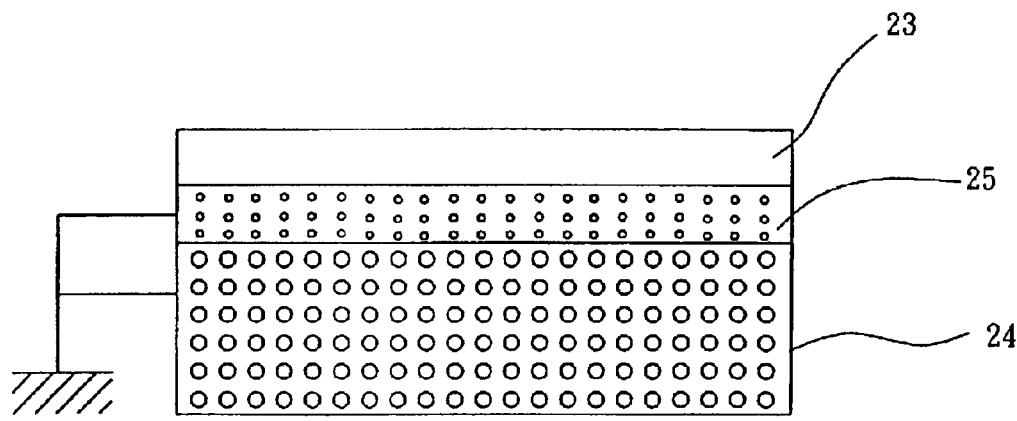
FIG. 3a is a schematic drawing of the second embodiment of the present invention.

FIG. 3a is a schematic drawing of the second embodiment of the present invention. According to this embodiment, the atomic number of the composition of the electron anti-reflective layer is smaller than that of the composition of the silicon substrate. Therefore, the atomic radius of the composition of the anti-reflective layer is relatively smaller. As illustrated, under the same arrangement of atoms, the atomic spacing is relatively greater if the atomic number is relatively smaller. Therefore, a relatively smaller amount of backward scattering electrons is produced when incident electrons strike the anti-electron reflective layer. When incident electrons pass the anti-reflective layer to strike the substrate, a lesser amount of backward scattering electrons is allowed to return to the electron resistant layer due to the blocking effect of the anti-reflective layer.

According to this embodiment, the electron anti-reflective layer is composed of atomic number 6 carbon or atomic number 13 aluminum that is smaller than the atomic number 14 silicon.

The material for the substrate can be metal, glass, or any of a variety of manufacturing materials using electron beams as the exposure light source. According to this embodiment, the silicon substrate is used to make compact disk molds.

Figure 3B:
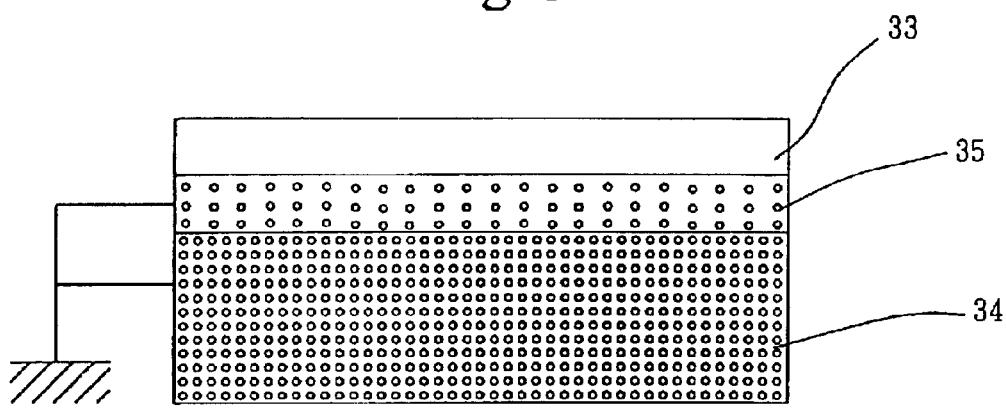
FIG. 3b is a schematic drawing of the third embodiment of the present invention.

FIG. 3b is a schematic drawing of the third embodiment of the present invention. According to this embodiment, an electron beam anti-reflective layer 35 is provided in between an electron resistant layer 33 and a silicon substrate 34. As illustrated, the arrangement of atoms in the anti-reflective layer is more sparse than the arrangement of the atoms in the silicon substrate, i.e., the atomic spacing of the composition of the anti-reflective layer is relatively greater, and therefore only a small amount of backward scattering is produced when an incident electron beam strikes the anti-reflective layer. When incident electrons pass the anti-reflective layer to strike the substrate, a greater amount of backward scattering electrons are produced; however due to the blocking effect of the anti-reflective layer, the amount of backward scattering atoms capable of returning to the electron resistant layer is greatly reduced.

According to this embodiment, the electron anti-reflective layer is composed of silicon dioxide or silicon nitride.

The material for the substrate can be metal, glass, or any of a variety of manufacturing materials using an electron beam as the exposure light source. According to this embodiment, the silicon substrate is used to make a master compact disk.

Figure 4:
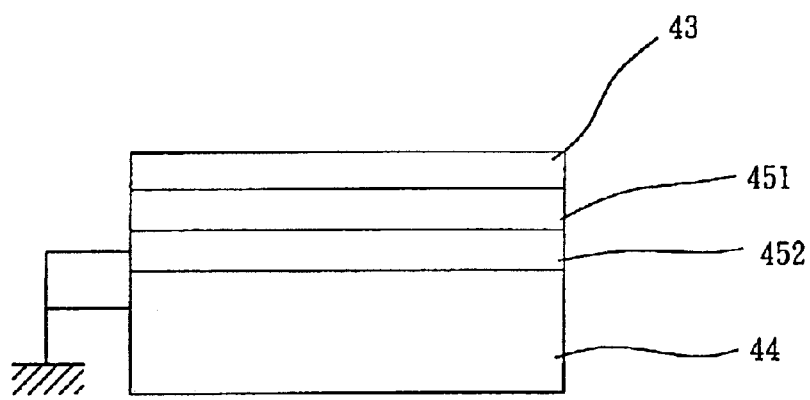
FIG. 4 is a schematic drawing of the fourth embodiment of the present invention.

FIG. 4 is a schematic drawing of the fourth embodiment of the present invention. According to this embodiment, two electron anti-reflective layers 451 and 452 are provided in between an electron resistant layer 43 and a silicon substrate 44. One electron beam anti-reflective layer 451 is a directional layer similar to the aforesaid first embodiment, which neighbors the electron resistant layer 43. The other anti-reflective layer 452, similar to the aforesaid second embodiment and third embodiment, has a relatively greater atomic spacing and, neighbors the silicon substrate 44. As to the exposure pattern by the electron beam, backward scattering electrons vertical or approximately vertical to the anti-reflective layer are acceptable. What should be prohibited are backward scattering electrons in a particular angle. Therefore, the first layer 451 does not affect the forwarding of electrons in the incident direction and the loose atomic spacing in the second layer 452 reduces the amount of backward scattering electrons, achieving the first effect of this fourth embodiment; the directional anti-reflective layer limits the scattering angle of backward scattering electrons when backward scattering electrons return to the first layer, achieving the second effect of this fourth embodiment. By means of the aforesaid two effects, the amount of backward scattering electrons returning to the electron resistant layer is minimized and its distribution is limited.

The material for the substrate can be metal, glass, or any of a variety of manufacturing materials using an electron beam as an exposure light source. According to this embodiment, the silicon substrate is used to make compact disk molds.

Prototypes of electron anti-reflection arrangements have been constructed with the features of FIGS. 2~4. The anti-reflection arrangements function smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An electron anti-reflector arrangement, comprising:
   a substrate having a top side;
   an electron resistant layer disposed above the top side of said substrate; and
   a first electron anti-reflective layer and a second electron anti-reflective layer both provided in between said substrate and said electron resistant layer for enabling an electron beam to pass through said first and second anti-reflective layers to the inside of said substrate in an incident direction and minimizing the amount of electrons of said electron beam that return to said electron resistant layer after being reflected by said substrate, wherein said first electron anti-reflective layer is disposed adjacent to said substrate and comprises material having an atomic number smaller than that of said substrate and said second electron anti-reflective layer is disposed adjacent to said electron resistant layer.

2. The electron anti-reflector arrangement as claimed in claim 1, wherein atoms in said first anti-reflective layer are separated more widely than atoms in said substrate.

3. The electron anti-reflector arrangement as claimed in claim 1, wherein atoms in said first anti-reflective layer have an atomic spacing greater than that of said substrate.

4. The electron anti-reflector arrangement as claimed in claim 3, wherein said atomic spacing of said second anti-reflective layer in said incident direction of said electron beam is greater than that of said first anti-reflective layer in a reflective direction of said electron beam when electrons are reflected by the substrate.

5. The electron anti-reflector arrangement as claimed in claim 3, wherein said atomic spacing of said first anti-reflective layer in the direction perpendicular to said incident direction of said electron beam is greater than that of said substrate in the same direction.

6. The electron anti-reflector arrangement as claimed in claim 1, wherein said substrate is a silicon wafer substrate.

7. The electron anti-reflector arrangement as claimed in claim 1, wherein said first anti-reflective layer is formed on said substrate by thin-film deposition.

8. The electron anti-reflector arrangement as claimed in claim 1, wherein said first anti-reflective layer is composed of carbon and said second anti-reflective layer is composed of silicon dioxide.

9. The electron anti-reflector arrangement as claimed in claim 1, wherein said first anti-reflective layer is composed of aluminum and said second anti-reflective layer is composed of silicon nitrides.

10. An electron anti-reflector arrangement, comprising:

a silicon substrate having a top side;

a first electron anti-reflection layer on the top side of the substrate, the first electron anti-reflection layer comprising material selected from the group consisting of carbon and aluminum;

a second electron anti-reflection layer on the first electron anti-reflection layer, the second electron anti-reflection layer comprising material selected from the group consisting of silicon dioxide and silicon nitrides; and a layer of electron-sensitive resist material that is deposited on the second electron anti-reflection layer to receive an exposure by an electron beam.

* * * * *